US009006761B2

(12) United States Patent
Oyamada (10) Patent No.: US 9,006,761 B2
(45) Date of Patent: Apr. 14, 2015

(54) LIGHT-EMITTING DEVICE (75) Inventor: Nodoka Oyamada, Fujiyoshida (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 237 days.

(21) Appl. No.: 12/545,580

(22) Filed: Aug. 21, 2009

(65) Prior Publication Data
US 2010/0044735 A1 Feb. 25, 2010

(30) Foreign Application Priority Data

Aug. 25, 2008 (JP) ................. 2008-215612

(51) Int. Cl.
*H01L 33/00* (2010.01)
*H01L 33/50* (2010.01)
*H01L 33/54* (2010.01)
*H01L 33/60* (2010.01)

(52) U.S. Cl.
CPC ............... *H01L 33/504* (2013.01); *H01L 33/54* (2013.01); *H01L 33/60* (2013.01); *H01L 2224/48091* (2013.01)

(58) Field of Classification Search
USPC .......... 257/98, E33.07, E33.061, 301; 438/26
See application file for complete search history.

(56) References Cited

U.S. PATENT DOCUMENTS 5,814,837 A * 9/1998 Okazaki ........................ 257/91
5,959,316 A * 9/1999 Lowery ......................... 257/98

(Continued)

FOREIGN PATENT DOCUMENTS

JP 2003-124521 4/2003
JP 2004004626 1/2004

(Continued)

OTHER PUBLICATIONS

English-language translation of Office Action issued on Feb. 4, 2013, in corresponding Japanese patent application No. 2008-215612 (5 pages).

*Primary Examiner* — Mohammad Islam
*Assistant Examiner* — Ankush Singal
(74) *Attorney, Agent, or Firm* — Browdy and Neimark, PLLC (57) ABSTRACT A light-emitting device includes a substrate (4), a light-emitting element (10) mounted on the substrate (4), a first resin (12) disposed to cover an upper portion of the light-emitting element (10), a second resin (14) disposed to cover a lower portion of the light-emitting element (10), a first phosphor (18) contained in the first resin (12), and a second phosphor (20) contained in the second resin (14). The first phosphor (18) converts light emitted directly from the light-emitting element (10) into a first phosphor-converted light having a wavelength longer than that of the light emitted directly from the light-emitting element (10) and emits the first phosphor-converted light, and the second phosphor (20) converts the light emitted directly from the light-emitting element (10) into a second phosphor-converted light having a wavelength longer than that of the first phosphor-converted light and emits the second phosphor-converted light. Because both the first and second resins (12, 14) have portions in contact with the light-emitting element (10), respectively, the first and second phosphors (18, 20) receive the light emitted directly from the light-emitting element (10) to convert the light emitted from the light-emitting element (10) into the first and second phosphor-converted lights, respectively. Positions of the first and the second resins are arranged depending on the wavelength range of light which respective phosphors can convert.

19 Claims, 4 Drawing Sheets (56) References Cited

U.S. PATENT DOCUMENTS

| | | | |
|---|---|---|---|
| 6,580,097 B1* | 6/2003 | Soules et al. | 257/100 |
| 6,774,401 B2* | 8/2004 | Nakada et al. | 257/82 |
| 6,791,116 B2* | 9/2004 | Takahashi et al. | 257/79 |
| 6,835,960 B2* | 12/2004 | Lin et al. | 257/81 |
| 6,850,001 B2* | 2/2005 | Takekuma | 313/501 |
| 6,917,057 B2* | 7/2005 | Stokes et al. | 257/98 |
| 7,126,273 B2* | 10/2006 | Sorg | 313/512 |
| 7,371,593 B2* | 5/2008 | Harada | 438/26 |
| 7,442,563 B2* | 10/2008 | Harada | 438/26 |
| 7,508,129 B2* | 3/2009 | Watanabe et al. | 313/506 |
| 7,539,223 B2* | 5/2009 | Tokunaga | 372/23 |
| 7,622,748 B2* | 11/2009 | Yatsuda et al. | 257/98 |
| 7,679,101 B2* | 3/2010 | Ota et al. | 257/100 |
| 7,737,623 B2* | 6/2010 | Kaneda et al. | 313/503 |
| 7,745,985 B2* | 6/2010 | Tanimoto et al. | 313/501 |
| 7,754,527 B2* | 7/2010 | Ueno | 438/106 |
| 7,775,687 B2* | 8/2010 | Nishi et al. | 362/329 |
| 7,985,980 B2* | 7/2011 | Matsuda et al. | 257/98 |
| 2003/0214233 A1* | 11/2003 | Takahashi et al. | 313/512 |
| 2003/0214725 A1 | 11/2003 | Akiyama | |
| 2004/0124429 A1* | 7/2004 | Stokes et al. | 257/98 |
| 2004/0217692 A1* | 11/2004 | Cho et al. | 313/503 |
| 2005/0145854 A1* | 7/2005 | Seto et al. | 257/79 |
| 2005/0219835 A1* | 10/2005 | Nagayama | 362/84 |
| 2005/0253158 A1* | 11/2005 | Yasukawa et al. | 257/98 |
| 2005/0280354 A1* | 12/2005 | Liu | 313/502 |
| 2006/0065906 A1* | 3/2006 | Harada | 257/98 |
| 2006/0170332 A1* | 8/2006 | Tamaki et al. | 313/498 |
| 2006/0226759 A1* | 10/2006 | Masuda et al. | 313/486 |
| 2007/0080636 A1* | 4/2007 | Lee | 313/512 |
| 2007/0096113 A1* | 5/2007 | Inoshita et al. | 257/79 |
| 2007/0139949 A1* | 6/2007 | Tanda et al. | 362/551 |
| 2007/0194341 A1* | 8/2007 | Chang et al. | 257/99 |
| 2007/0215890 A1* | 9/2007 | Harbers et al. | 257/98 |
| 2007/0222360 A1* | 9/2007 | Kaneda et al. | 313/483 |
| 2007/0223219 A1* | 9/2007 | Medendorp et al. | 362/231 |
| 2008/0032142 A1* | 2/2008 | Tasumi et al. | 428/447 |
| 2008/0149960 A1* | 6/2008 | Amo et al. | 257/98 |
| 2008/0191620 A1* | 8/2008 | Moriyama et al. | 313/506 |
| 2008/0213928 A1* | 9/2008 | Harada | 438/26 |
| 2008/0237614 A1* | 10/2008 | Ishikura et al. | 257/89 |
| 2008/0290785 A1* | 11/2008 | Schmidt et al. | 313/501 |
| 2008/0303410 A1* | 12/2008 | Kaneda et al. | 313/503 |
| 2008/0315235 A1* | 12/2008 | Murazaki | 257/98 |
| 2009/0014741 A1* | 1/2009 | Masuda et al. | 257/98 |
| 2009/0015137 A1* | 1/2009 | Su et al. | 313/503 |
| 2009/0039762 A1* | 2/2009 | Park et al. | 313/502 |
| 2009/0140633 A1* | 6/2009 | Tanimoto et al. | 313/503 |
| 2009/0236622 A1* | 9/2009 | Nishihara | 257/98 |
| 2009/0272985 A1* | 11/2009 | Ishii et al. | 257/88 |
| 2010/0157583 A1* | 6/2010 | Nakajima | 362/184 |
| 2010/0213821 A1* | 8/2010 | Masuda et al. | 313/501 |
| 2010/0219745 A1* | 9/2010 | Tanimoto et al. | 313/498 |
| 2010/0230693 A1* | 9/2010 | Tran | 257/98 |
| 2011/0006673 A1* | 1/2011 | Yano et al. | 313/512 |
| 2011/0244606 A1* | 10/2011 | Matsuda et al. | 438/26 |
| 2012/0098007 A1* | 4/2012 | Kuo | 257/98 |

FOREIGN PATENT DOCUMENTS

| | | | |
|---|---|---|---|
| JP | 2004-071710 | | 3/2004 |
| JP | 2005311136 A | | 11/2005 |
| JP | 2007-184326 | | 7/2007 |
| JP | 2008-506246 | | 2/2008 |
| WO | 2006/006544 A1 | | 1/2006 |
| WO | WO2006003931 | * | 1/2006 ............. H01L 33/00 |
| WO | WO2007052777 | * | 5/2007 ............. H01L 33/00 |

* cited by examiner

LIGHT-EMITTING DEVICE

CROSS-REFERENCE TO THE RELATED APPLICATION

This application is based on and claims the priority benefit of Japanese Patent Application No. 2008-215612, filed on Aug. 25, 2008, the disclosure of which is incorporated herein by reference in its entirety.

BACKGROUND OF THE INVENTION

1. Field of the Invention

The present invention relates to a light-emitting device using a light-emitting element, more specifically, to a light-emitting device configured to improve emission efficiency by arranging positions of a first resin and a second resin both having portions in direct contact with the light-emitting element and including a phosphor different from each other.

2. Description of the Related Art

In recent years, with development of a blue light-emitting diode (light-emitting diode is referred to hereinafter as LED) element having high emission efficiency, there is developed a display device achieving a full color display by combining a blue LED including the blue LED element, a red LED and a green LED (for reference, see Japanese Patent Application Publication No. 2004-4626). Such a display device includes color filters that receive light emitted from the red, green, and blue LED elements and a white LED, and the filters allow passage of red light, green light, and blue light.

The white LED generally used for such a display device has a structure in which the blue LED element and a yellow phosphor disposed to receive some blue light and emit yellow light are contained in one package. White light emitted from the entire package of the white LED is a color-mixing effect of blue light and yellow light.

However, when white light emitted from the white LED passes through the color filters described above, a color of light without a wavelength peak, for example, green light tends to be insufficient. Therefore, an LED that emits white light having wavelength peaks of RGB (red, green, and blue) is required, because RGB colors of light fit in wavelength ranges of light that pass through the color filters to produce RGB-color-balanced white light. Therefore, white LED that includes a blue LED element, a red phosphor and a green phosphor contained in one package is considered to be suitable for a display device (for reference, see Japanese Patent Application Publication No. 2005-311136).

However, in the aforementioned white LED, because a wavelength range of light that a phosphor converts is different from one another, depending on characteristics of the phosphor, and a red phosphor, for example, generally converts not only blue light emitted directly from the blue LED element, but also some green light already converted by the green phosphor to red light, there is a problem in color balance of light emitted from the entire package of the white LED.

SUMMARY OF THE INVENTION

An object of the present invention is to provide a light-emitting device capable of emitting blue light, green light and red light efficiently.

To accomplish the above object, a light-emitting device according to an embodiment of the present invention includes a substrate, a light-emitting element mounted on the substrate, a first resin disposed in direct contact with a portion of the light-emitting element, a second resin disposed in direct contact with another portion of the light-emitting element, a first phosphor contained in the first resin, and a second phosphor contained in the second resin, and positions of the first and the second resins are arranged, depending on the wavelength range of light which respective first and second phosphors can convert.

The first phosphor converts light to a first phosphor-converted light having a wavelength longer than that of light emitted directly from the light-emitting element.

The second phosphor converts light to a second phosphor-converted light having a wavelength longer than that of the first phosphor-converted light emitted from the first phosphor, and the second phosphor converts light of wider wavelength range than the wavelength range of light that the first phosphor converts.

Therefore, the second resin including the second phosphor is arranged at an inner position of the light-emitting device, compared with a position of the first resin including the first phosphor, to prevent the first phosphor-converted light from exciting the second phosphor.

The light-emitting element is, for example, a blue LED element, and the first phosphor is, for example, a green phosphor that converts light to green light, and the second phosphor is, for example, a red phosphor that converts light to red light. The red phosphor converts light of wider wavelength range than the wavelength range of light that the green phosphor converts.

A portion of light emitted from the light-emitting element excites both the first and second phosphors to emit a different color of light.

DETAILED DESCRIPTION OF THE PREFERRED EMBODIMENTS

A light-emitting device according to the present invention basically includes a substrate, a light-emitting element mounted on the substrate, a first resin and a second resin, and a first phosphor contained in the first resin and a second phosphor contained in the second resin.

Each of the first resin and the second resin has at least one portion directly in direct contact with the light-emitting element and is configured to receive light emitted directly from the light-emitting element, and the first resin may be arranged to receive not only the direct light from the light-emitting element but the light transmitted through the second resin containing the second phosphor. The first phosphor receives a portion of light emitted directly from the light-emitting element and emits a first phosphor-converted light having a wavelength longer than that of the received light emitted directly from the light-emitting element after converting a wavelength of the received light. The second phosphor receives a portion of light emitted directly from the light-emitting element and emits a second phosphor-converted light having a wavelength longer than that of the first phosphor-converted light emitted from the first phosphor after converting the wavelength of the received light emitted directly from the light-emitting element. Both the first resin including the first phosphor and the second resin including the second phosphor are disposed directly in contact with the light-emitting element. Furthermore, the second resin is disposed at an inner position of the light-emitting device, compared with a position of the first resin.

Embodiments of the light-emitting device according to the present invention will be explained in detail hereinafter with reference to the accompanying drawings.

Here, identical reference numbers are attached to similar portions of light-emitting devices in these embodiments. Repeated descriptions of corresponding portions with the same numbers, and repeated descriptions of substantially similar parts are omitted.

<First Embodiment>

Figure 1:
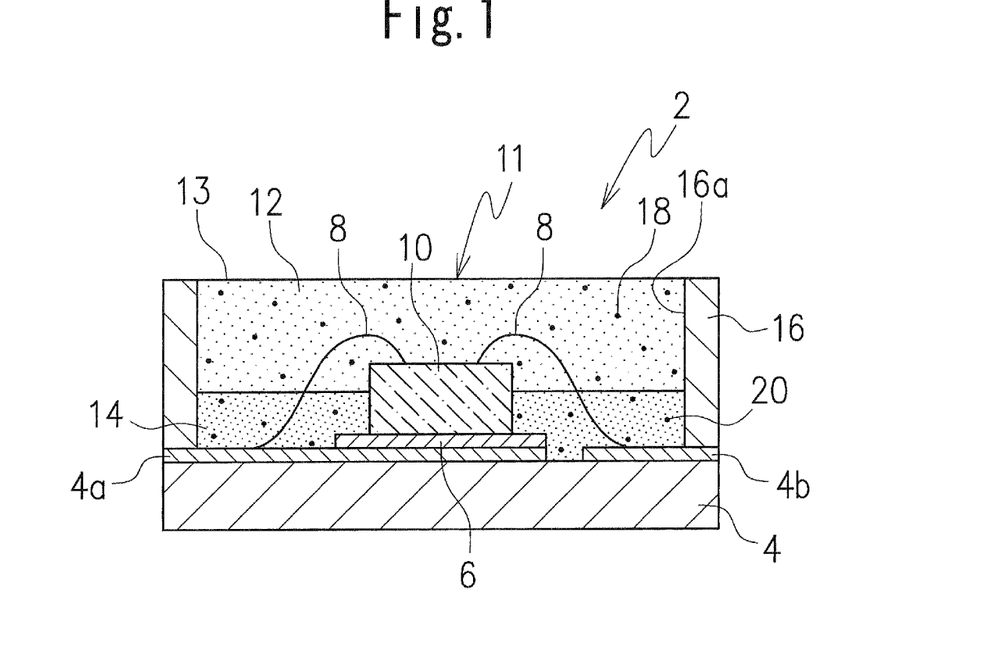
FIG. 1 is a sectional view of a light-emitting device according to a first embodiment of the present invention.

FIG. 1 illustrates a light-emitting device according to a first embodiment of the present invention. The light-emitting device 2 in the first embodiment includes a substrate 4 and conductive patterns 4a and 4b provided on the substrate 4, a light-emitting element 10 as a light source which is electrically connected to the conductive patterns 4a and 4b by wires 8, for example, and a sealing resin 11 sealing the light-emitting element 10. In this embodiment, the light-emitting element is directly mounted on one of the conductive patterns, however, the light-emitting element may be electrically mounted on the conductive patterns through bumps. In the first embodiment, the sealing resin 11 includes a first resin 12 sealing and in direct contact with an upper portion of the light-emitting element 10 and containing a first phosphor 18, and a second resin 14 in direct contact with a lower portion or lower peripheral side surfaces of the light-emitting element 10 and containing a second phosphor 20 (see FIG. 1). In the first embodiment, the first resin 12 and the second resin 14 have respective peripheral side surfaces forming flush peripheral side surfaces of the sealing resin 11, therefore, the sealing resin 11 has a rectangular parallelepiped or a cubic shape.

Meanwhile, peripheral side surfaces of the sealing resin 11, that is to say, respective peripheral side surfaces or respective four-side surfaces of each of the first resin 12 and the second resin 14 are surrounded by a frame 16 which is fixed to the upper surface of the substrate 4 (see FIG. 1). In this way, in the structure where the frame 16 is disposed to surround the respective peripheral side surfaces of the first and second resins 12 and 14, when the first and second resins 12 and 14 are formed, a fluid resin material of the second resin 14 including the second phosphor is put in the frame 16 to be in direct contact with at least the lower peripheral side surfaces of the light-emitting element, and a fluid resin material of the first resin 12 including the first phosphor is positioned on an upper surface of the second resin 14 to be in direct contact with at least an upper portion of the light-emitting element in the frame 16.

In the light-emitting device 2 structured as mentioned above, the first resin 12 containing the first phosphor 18 is disposed at an upper side which is outward and the second resin 14 containing the second phosphor 20 is disposed at a lower side which is an inner position, within the frame 16, and an upper surface of the first resin 12 which is disposed at an outer position serves as an emission surface 13 of the light-emitting device 2.

The light-emitting element 10 in the first embodiment is, for example, a blue LED element using an InGaN (indium gallium nitride) based compound semiconductor having an emission wavelength range of, for example, 470 to 490 nm.

The substrate 4 is formed by, for example, an insulating plate member made of glass, epoxy, a BT (bismaleimide triazine) resin, ceramic, metal core or the like and having, for example, a generally rectangular or square shape in top plan view. As mentioned above, the conductive patterns 4a and 4b are provided on at least the upper surface of the substrate 4, and the light-emitting element 10 is, for example, die-bonded on one of the conductive patterns 4a through a die-bonding paste 6 and electrically connected to the conductive patterns 4a and 4b by the wires 8, respectively. Conductive patterns may be provided on a lower surface of the substrate for electrical connection to an external electronic device, and through-holes electrically connecting conductive patterns on the upper surface and the lower surface of the substrate may be provided, for example.

The first resin 12 in the first embodiment is formed by including the first phosphor 18 which converts light emitted from the light-emitting element 10 into the first phosphor-converted light having a wavelength longer than that of the light emitted from the light-emitting element 10, in a transparent resin made of epoxy resin, silicone resin or the like. In addition, the second resin 14 is formed by including the second phosphor 20 which converts light emitted from the light-emitting element 10 into second phosphor-converted light having a wavelength longer than that of the first phosphor-converted light, in the same transparent resin as mentioned above.

The second resin 14 is disposed at a position lower than an upper surface of the light-emitting element 10 and is provided to seal a lower portion of the light-emitting element 10, the conductive patterns 4a and 4b, a vicinity of connecting portions of lower ends of the wires 8 to the conductive patterns 4a and 4b, and the upper surface of the substrate 4, as shown in FIG. 1. In addition, the first resin 12 is disposed on the second resin 14 and is provided to seal an upper portion of the light-emitting element 10 and a vicinity of connecting portions of upper ends of the wires 8 to the light-emitting element 10. Consequently, the first resin 12 is disposed in direct contact with the upper surface and upper outer peripheral side surfaces of the light-emitting element 10, and the second resin 14 is disposed in contact with lower outer peripheral side surfaces of the light-emitting element 10 (see FIG. 1).

In addition, in the first embodiment, the blue LED element as mentioned above is used for the light-emitting element 10, a green phosphor which converts some blue light emitted from the blue LED element to a first phosphor-converted green light having a wavelength longer than that of the blue light is used for the first phosphor 18, and a red phosphor which converts some blue light emitted from the blue LED element into a second phosphor-converted red light having a wavelength longer than that of the first phosphor-converted green light is used for the second phosphor 20. A phosphor, for example, $SrGa_2S_4$:Eu, Pr, $(BaSr)_2SiO_4$:Eu, $BaMgAl_{10}O_{17}$:Eu, Mn, or the like is used for the green phosphor. A phosphor material or the like, for example, such as $CaAlSiN_3$ (calcium, aluminum, silicon three-nitride) in which europium ($Eu^{2+}$) is contained in a state of solid solution or $(SrCa)AlSiN_3$:Eu is used for the red phosphor. Consequently, the blue light emitted from the light-emitting element 10 is converted into lights of respective colors by the first phosphor 18 and the second phosphor 20.

Figure 7:
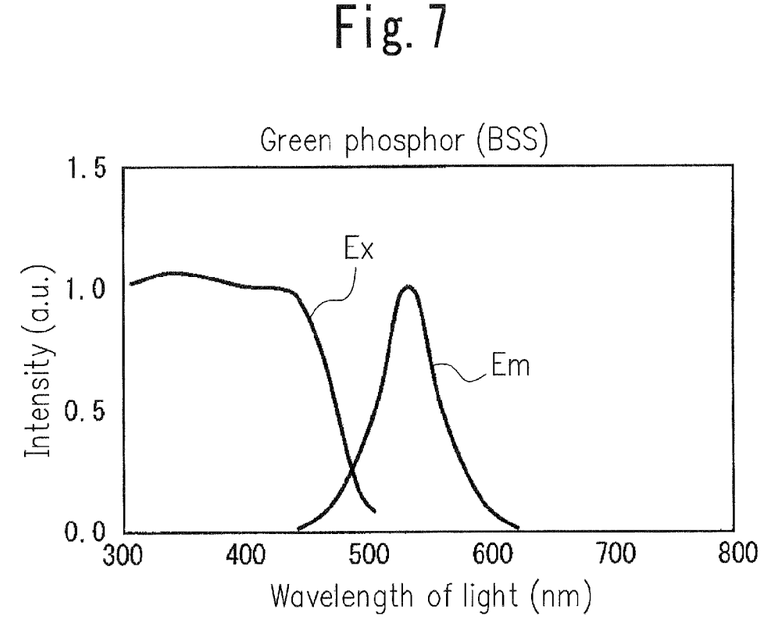
FIG. 7 shows characteristics of a green phosphor used in an embodiment of the present invention.
Figure 8:
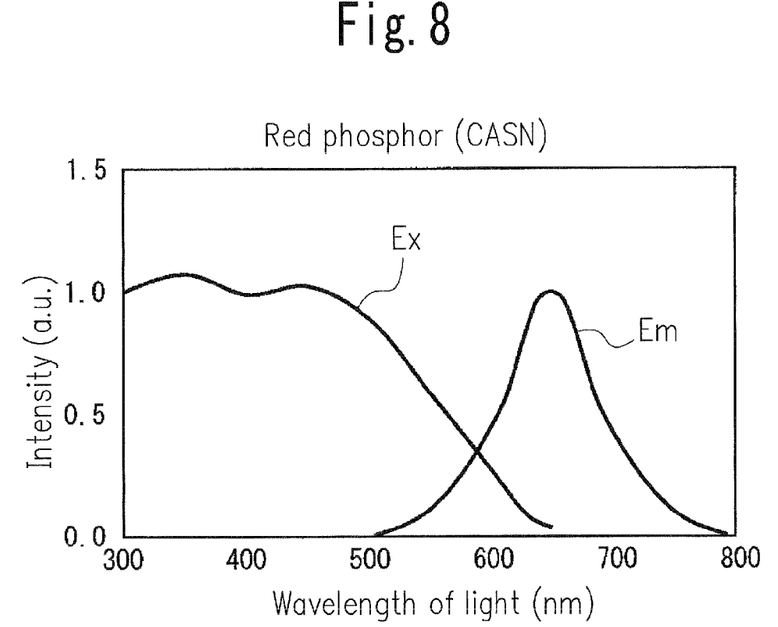
FIG. 8 shows characteristics of a red phosphor used in an embodiment of the present invention.

FIG. 7 shows characteristics of a green phosphor as a first phosphor in an embodiment of the present invention, and FIG. 8 shows characteristics of a red phosphor as a second phosphor in an embodiment of the present invention. In FIGS. 7 and 8, the vertical axis shows intensity of light (a.u.), and the horizontal axis shows wavelength range of light (nm).

In FIG. 7, "Ex" shows a wavelength range of light that excites a green phosphor to emit green light and "Em" is a wavelength range of green light converted and emitted by the green phosphor. "Ex" that excites the green phosphor is light having a shorter wavelength than 500 nm, and "Em" that is emitted by the green phosphor after converting light "Ex" to "Em" is light having a wavelength peak around 530 nm.

In FIG. 8, "Ex" shows a wavelength range of light that excites a red phosphor to emit red light and "Em" is a wavelength range of red light converted and emitted by the red phosphor. "Ex" that excites the red phosphor is light having a shorter wavelength than 600 nm, and "Em" that is emitted by the red phosphor after converting light "Ex" to "Em" is light having a wavelength peak around 650 nm.

Most of light with a wavelength longer than 500 nm does not excite the green phosphor of FIG. 7, and passes through the resin including the green phosphor without being converted by the green phosphor, however the red phosphor in FIG. 8 can be excited by light of a wider range of wavelength including the wavelength peak of green light "Em" converted by the green phosphor in FIG. 7.

Therefore, positions of the first resin and the second resin including respective phosphors are important, and the second resin including the second phosphor is preferably disposed at an inner position of the light-emitting device, compared with the position of the first resin including the first phosphor.

The frame 16 includes a reflection surface 16a such as a mirror surface or the like, which is provided on at least one of inner side surfaces facing and contacting with the peripheral side surfaces of the first resin 12 and the second resin 14.

Consequently, the blue light emitted from the light-emitting element 10, and the first and second phosphor-converted lights are reflected on the reflection surface 16a to further increase emission efficiency.

In the light-emitting device 2 structured as mentioned in the first embodiment, the light-emitting element 10 as the blue LED element here emits blue light hemispherically toward the emission surface 13. At this time, the first and second phosphors 18 and 20 are configured to receive some blue light emitted directly from the light-emitting element 10, because the first and second resins 12 and 14 have respective portions in direct contact with the light-emitting element 10, and convert the blue light to green light or green spectrum light and red light or red spectrum light, respectively, to thus emit the green and red lights.

Here, some blue light of a short wavelength passes through the first resin 12 and is sufficiently emitted from the emission surface 13 as blue light.

In addition, because the red light emitted from the second phosphor 20 is in a longer wavelength range, it passes easily through the first resin 12 without being converted by the green phosphor as the first phosphor, because most of the red light does not excite the green phosphor, and therefore, sufficient red light is emitted from the emission surface 13. Furthermore, the green light which is the first phosphor-converted light emitted from the first phosphor 18 is directly emitted from the first resin 12 to be directed upwardly as viewed in FIG. 1 without exciting the red phosphor as the second phosphor 20. In other words, because the first phosphor 20 is at an outer side of the light-emitting device, sufficient green light is emitted from the emission surface 13 of the light-emitting device without interference. Moreover, a portion of each of the blue light, the red light and the green light is reflected on the reflection surface 16a of the frame 16 before arriving at the emission surface 13, and is emitted from the emission surface 13 of the light-emitting device.

In this way, in the light-emitting device 2 in the first embodiment, the blue light emitted from the light-emitting element 10 is configured to have its wavelength converted by the first and second phosphors 18 and 20 directly and sufficiently, and thus the first and second phosphors 18 and 20 emit respective colored lights. The converted lights and the direct light emitted from the light-emitting element 10 are directly and sufficiently achieved, and these RGB colors of light are emitted outwardly and sufficiently from the emission surface 13 of the light-emitting device directly and indirectly after being reflected on the reflection surface 16a of the frame 16. Consequently, the blue, red and green lights emitted from the emission surface 13 appear to be RGB-color-balanced white light having a peak value of each of blue, red and green.

<Second Embodiment>

Figure 2:
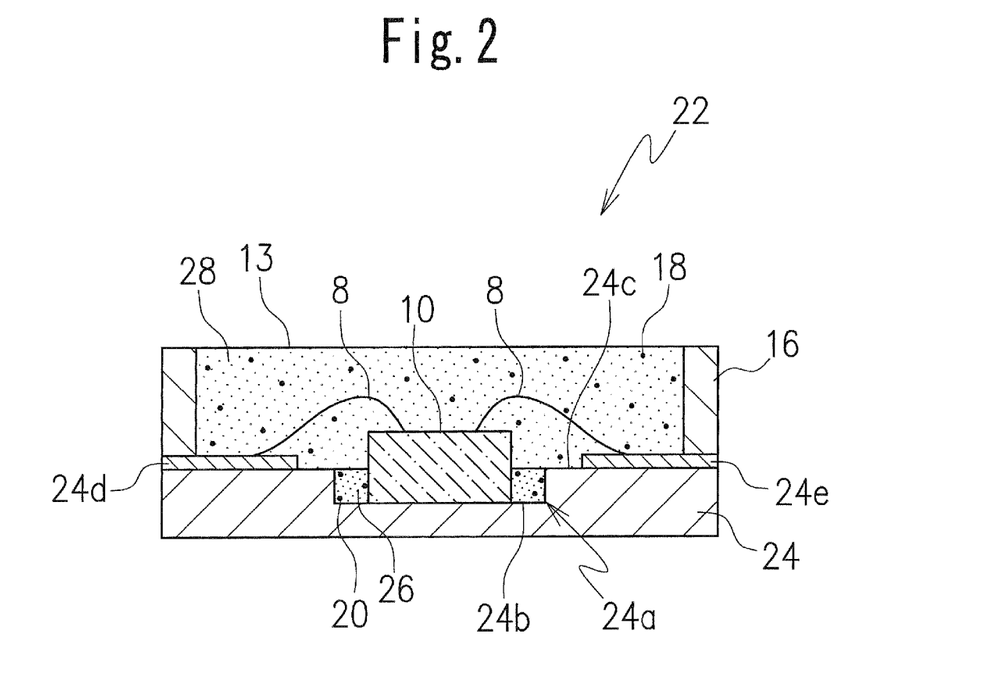
FIG. 2 is a sectional view of a light-emitting device according to a second embodiment of the present invention.

FIG. 2 illustrates a light-emitting device according to a second embodiment of the present invention. In the light-emitting device 22 in the second embodiment, the light-emitting element 10 is contained in a hollow 24a provided in an upper surface 24c of a substrate 24 which is similar to the substrate 4 in shape and material except the hollow 24a. The hollow 24a is provided at an approximately central portion of the upper surface 24c of the substrate 24. Conductive patterns 24d and 24e are provided at least on the upper surface 24c of the substrate 24. The light-emitting element 10 is disposed on a bottom surface 24b of the hollow 24a. Electrodes of the light-emitting element 10 are wire-bonded to the conductive patterns 24d and 24e on the upper surface of the substrate 24 through wires 8.

A depth of the hollow 24a, in other words, a distance between the upper surface 24c of the substrate 24 and the bottom surface 24b of the hollow 24a is set to be smaller than a height of the light-emitting element 10. Therefore, an upper portion of the light-emitting element 10 is disposed above the upper surface 24c.

Here, in the second embodiment, a space of a circumference of the light-emitting element 10 in the hollow 24a is filled with a second resin 26, and an upper portion of the light-emitting element 10, the wires 8, the conductive patterns 24d and 24e on the upper surface of the substrate are sealed by a first resin 28 disposed on the upper portion of the light-emitting element 10, the upper surface of the substrate 24, and the upper surface of the second resin 26. The second resin 26 comprises a transparent resin similar to the second resin 14 in the first embodiment and contains a second phosphor, for example, the red phosphor 20 similar to the first embodiment. At the same time, the first resin 28 is disposed to seal the upper portion of the light-emitting element 10 and an upper surface of the second resin 26, and configured to contain a first phosphor, that is to say, the green phosphor 18, for example, in a transparent resin, similarly to the first resin 12 in the first embodiment.

The light-emitting device 22 also includes a frame 16 disposed to surround peripheral side surfaces of the first resin 28. The frame may have the same structure as that of the first embodiment.

In the light-emitting device 22 in the second embodiment structured as mentioned above, a lower portion of the light-emitting element 10 is sealed by the second resin 26 and the upper portion of the light-emitting element 10 is sealed by the first resin 28, respectively, by providing the hollow 24a in the substrate 24, attaching the light-emitting element 10 to the bottom surface 24b of the hollow 24a, disposing the second resin 26 containing the second phosphor 20 in a space surrounding lower peripheral side surfaces of the light-emitting element 10 in the hollow 24a, and disposing the first resin 28 containing the first phosphor 18 in the frame 16 on an upper surface of the second resin 26 and the upper surface of the substrate 24. The second resin 26 and the first resin 28 have respective portions directly in contact with the light-emitting element 10, in other words, the first resin 28 is disposed in direct contact with the upper surface and upper peripheral side surfaces of the light-emitting element 10, and the second resin 26 is disposed in direct contact with lower peripheral side surfaces of the light-emitting element 10, the first and second resins being configured to directly receive light emitted from the light-emitting element 10.

Consequently, the first and second phosphors 18 and 20 convert the direct light from the light-emitting element 10 to respective colored lights and emit the converted lights respectively. Therefore, the light-emitting device makes it possible to emit sufficient phosphor-converted lights by receiving the light emitted directly from the light-emitting element 10 without the phosphor-converted lights interfering with each other by arranging positions of the first and the second resins, similarly to the light-emitting device 2 in the first embodiment. Also, in the light-emitting device 22, because light emitted from the light-emitting element 10, the first phosphor 18 and the second phosphor 20 are radiated upwardly and sufficiently and emitted from the emission surface 13, similarly to the first embodiment, it is possible to excite the respective phosphors sufficiently without interference and improve emission efficiency.

In addition, in the light-emitting device 22 in the second embodiment, the disposition of the light-emitting element 10 in the hollow 24a of the substrate 24 makes it possible to thin the entirety of the light-emitting device 22.

<Third Embodiment>

Figure 3:
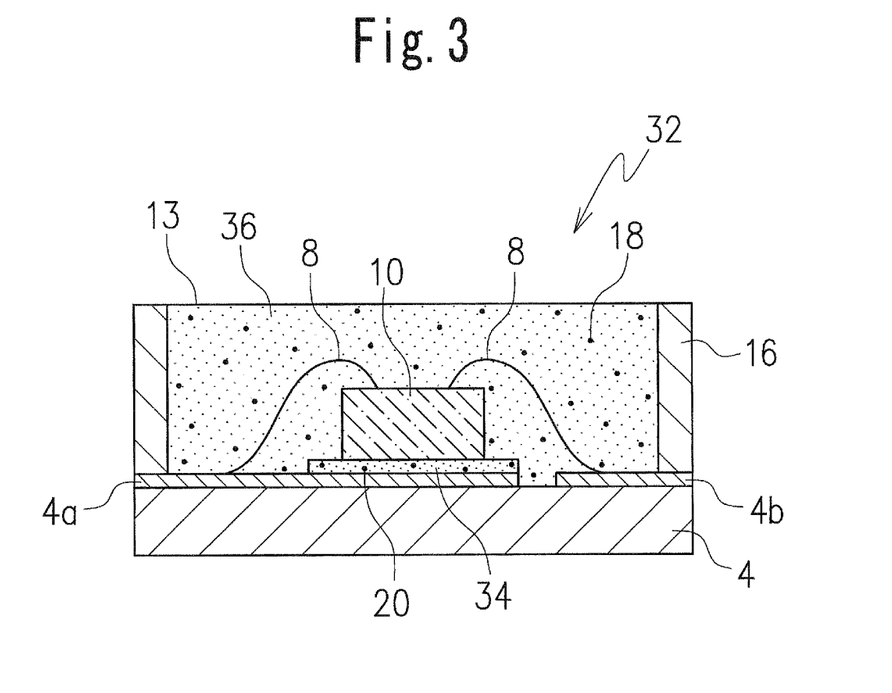
FIG. 3 is a sectional view of a light-emitting device according to a third embodiment of the present invention.

FIG. 3 illustrates a light-emitting device according to a third embodiment of the present invention.

The light-emitting device 32 in the third embodiment includes a substrate 4 provided with conductive patterns 4a and 4b, a light-emitting element 10 mounted on one of the conductive patterns 4a and 4b of the substrate 4, a first resin 36 configured to seal the light-emitting element 10, and a frame 16 configured to surround peripheral side surfaces of the first resin 36, similarly to the first embodiment.

In the light-emitting device 32, a second resin is a die-bonding paste 34 containing a second phosphor 20 and disposed under a lower surface of the light-emitting element 10. The die-bonding paste 34 is configured to fix the lower surface of the light-emitting element 10 to one of the conductive patterns of the substrate 4, the conductive pattern 4b in this embodiment, and the second resin has a function of performing die-bonding and a wavelength-conversion of light emitted from the light-emitting element 10. The die-bonding paste as a second resin is configured to fix a bottom surface of the light-emitting element 10 to an upper surface of the substrate 4 or an upper surface of one of the conductive patterns, and the die-bonding paste contains the second phosphor 20. Consequently, the second resin or the die-bonding paste 20 preferably has an area larger than the lower surface of the light-emitting element 10, as shown in FIG. 3. In this embodiment, the first resin 36 containing a first phosphor 18 is disposed on the substrate 4 to seal the light-emitting element 10, wires 8 connecting electrodes of the light-emitting element 10 to the conductive patterns 4a and 4b, and the second resin 34. Note that the frame 16 is provided to surround peripheral side surfaces of the first resin 36.

In the light-emitting device 32 in the third embodiment structured as mentioned above, the first phosphor 18 is contained in the first resin 36 sealing the light-emitting element 10, and the second phosphor 20 is contained in the second resin of the type of the die-bonding paste 34 to fix the light-emitting element 10. Therefore, the first resin 36 and the second resin 34 which is the die-bonding paste are in direct contact with the light-emitting element 10; accordingly the first resin 36 and the second resin 34 are configured to receive the light emitted from the light-emitting element 10 directly. Consequently, the first and second phosphors 18 and 20 receive the light emitted from the light-emitting element 10 sufficiently and convert wavelengths of the received lights to green light and red light, respectively.

In addition, the light-emitting device is configured to emit light sufficiently from the light-emitting element 10, the first phosphor 18 and the second phosphor 20 through the emission surface 13 of the light-emitting device, similarly to the first embodiment, and hence it is possible to improve emission efficiency of the light-emitting device.

<Fourth Embodiment>

Figure 4:
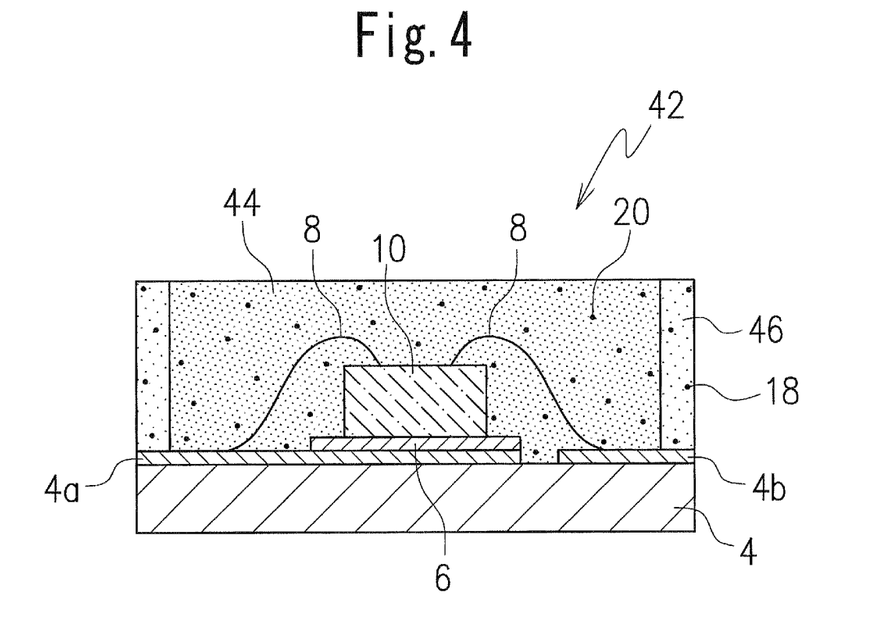
FIG. 4 is a sectional view of a light-emitting device according to a fourth embodiment of the present invention.

FIG. 4 illustrates a light-emitting device according to a fourth embodiment of the present invention.

The light-emitting device 42 in the fourth embodiment includes a substrate 4 provided with conductive patterns 4a and 4b, and a light-emitting element 10 which is mounted on the conductive pattern 4a through a die-bonding paste 6 and electrically connected to the conductive patterns 4a and 4b through wires 8, similarly to the light-emitting device 2 in the first embodiment.

In the light-emitting device 42, the light-emitting element 10 and the wires 8 are sealed by a second resin 44. The second resin 44 comprises a transparent resin in which a second phosphor 20 is contained. In the light-emitting device 42, a first resin 46 is disposed to surround peripheral side surfaces of the second resin 44. The first resin 46 comprises a transparent resin in which a first phosphor 18 is contained, similarly to the aforementioned embodiments.

In the light-emitting device 42 having the aforementioned structure, the second resin 44 that contains the second phosphor, for example, the red phosphor is configured to seal the light-emitting element 10, and the first resin 46 containing the first phosphor 18, for example, the green phosphor is disposed on the peripheral side surfaces of the second resin 44 to surround the peripheral side surfaces of the second resin 44. Here, the first resin 46 containing the first phosphor 18 is configured to have an area which is exposed to an outside larger than that of the second resin 44 containing the second phosphor 20. Meanwhile, the second resin 44 includes an upper surface exposed to the outside of the light-emitting device. In this way, because the second resin 44 and the first resin 46 are together configured to face or be exposed to the outside, emission efficiency of the light-emitting device is enhanced. The first resin 46 containing the first phosphor 18 which converts light emitted from the light-emitting element 10 into light having a wavelength shorter than that of second phosphor-converted light emitted from the second phosphor 20 can directly radiate outwardly with a larger area than that of the second resin 44, and therefore emission efficiency of the light-emitting device can be further improved. In this way, because lights from the first and second phosphors 18 and 20 can be radiated sufficiently and outwardly and a great deal of light having the shorter wavelength can be outwardly emitted from the first phosphor 18, it is possible to increase emission efficiency of the light-emitting device.

<Fifth Embodiment>

Figure 5:
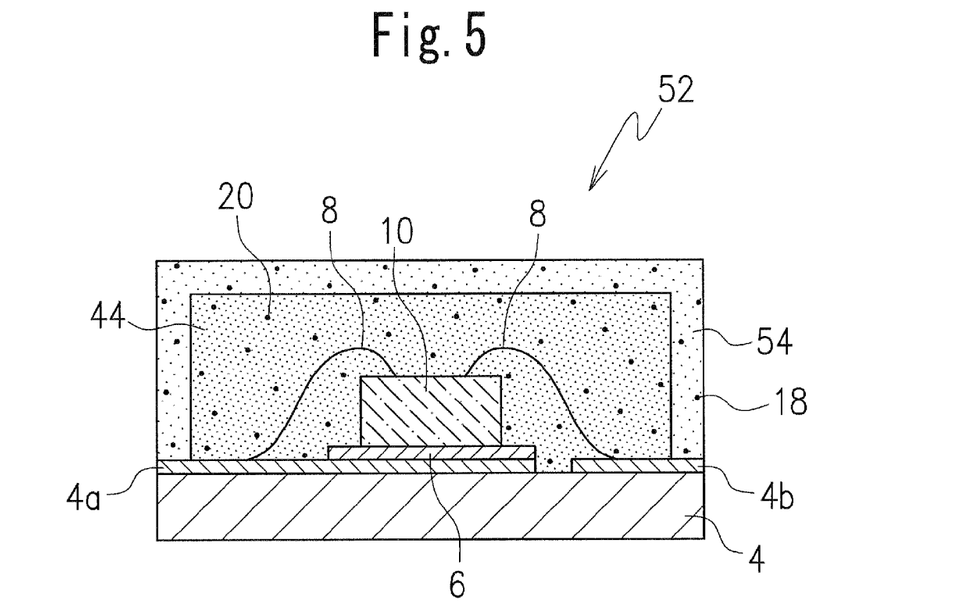
FIG. 5 is a sectional view of a light-emitting device according to a fifth embodiment of the present invention.

FIG. 5 illustrates a light-emitting device according to a fifth embodiment of the present invention.

The light-emitting device 52 in the fifth embodiment includes a substrate 4 provided with conductive patterns 4a and 4b, a light-emitting element 10 which is mounted on the conductive pattern 4a through a die-bonding paste 6 and electrically connected to the conductive patterns 4a and 4b through wires 8, and a second resin 44 sealing the light-emitting element 10 and the wires 8 and containing a second phosphor 20, similarly to the light-emitting device 42 in the fourth embodiment.

In the light-emitting device 52, a first resin 54 containing a first phosphor 18 is disposed to cover peripheral side surfaces and an upper surface of the second resin 44. In the light-emitting device 52, the first resin 54 containing the first phosphor 18 emitting first phosphor-converted light having a shorter wavelength than that of second phosphor-converted light emitted from the second phosphor 20 is disposed at a position outward of the second resin 44, and the first resin 54 has an area larger than that of the second resin 44; hence lights emitted from the light-emitting element 10, the first phosphor 18 and the second phosphor 20 can extensively be radiated outwardly. Consequently, it is possible to radiate sufficiently and outwardly the light from the first phosphor 18 which is relatively difficult to be radiated, whereby enabling emission efficiency of the light-emitting device to be increased.

<Sixth Embodiment>

Figure 6:
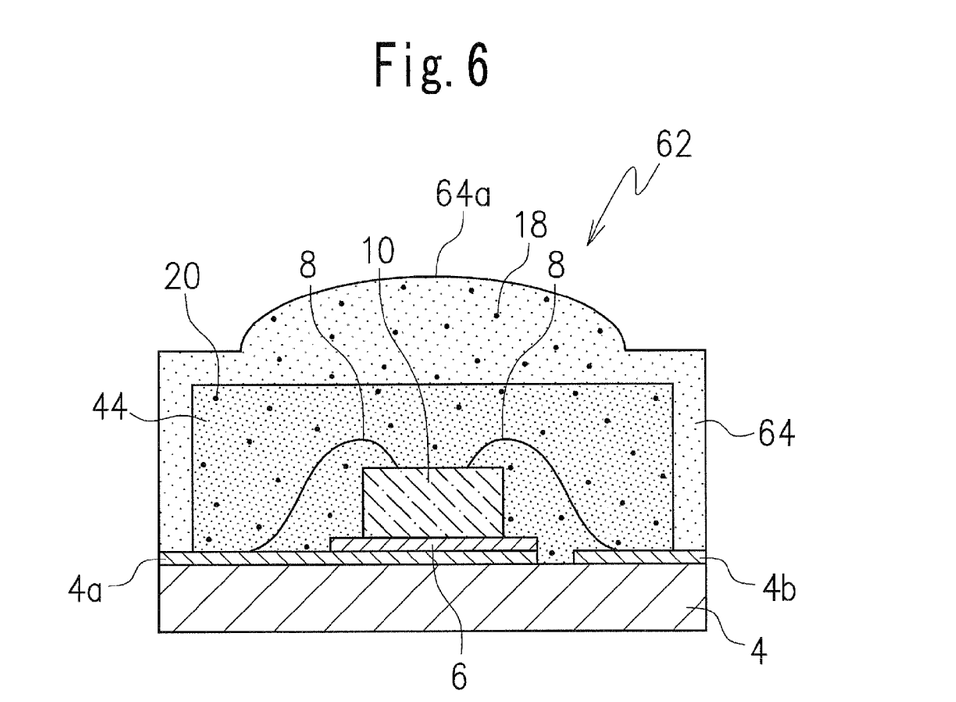
FIG. 6 is a sectional view of a light-emitting device according to a sixth embodiment of the present invention.

FIG. 6 illustrates a light-emitting device according to a sixth embodiment of the present invention.

The light-emitting device 62 in the sixth embodiment includes a substrate 4 provided with conductive patterns 4a and 4b, a light-emitting element 10 which is mounted on the conductive pattern 4a through a die-bonding paste 6 and electrically connected to the conductive patterns 4a and 4b through wires 8, and a second resin 44 sealing the light-emitting element 10 and the wires 8 and containing a second phosphor 20, similarly to the light-emitting device 52 in the fifth embodiment.

The light-emitting device 62 includes a first resin 64 which is configured to cover peripheral side surfaces and an upper surface of the second resin 44 and has a lens portion 64a disposed to face the light-emitting element 10. The lens portion 64a acts to collect light emitted from the second resin 44 and emit this collected light outwardly. The first resin 64 in the sixth embodiment comprises a transparent resin similar to the second resin 44 and so on, and has the lens portion 64a thereof configured to contain a first phosphor 18. In the light-emitting device 62, because the first phosphor 18 is provided in the lens portion 64a allowing light to collect, it is possible to achieve high radiation efficiency by collecting light emitted from the first phosphor 18 and having a shorter wavelength than that of the light emitted from the second phosphor 20 in an upper radiation direction. Consequently, the light emitted from the first phosphor 18 and relatively difficult to be radiated can be radiated sufficiently and outwardly. Meanwhile, the first phosphor 18 may be contained in the entirety of the first resin 64, without being limited to being contained in the lens portion 64a as mentioned above.

As mentioned above, because the light-emitting device according to the present invention is configured to receive directly the blue light emitted from the light-emitting element by the first resin containing the green phosphor and the second resin containing the red phosphor, respectively, or first receive directly the light emitted from the light-emitting element by the second resin containing the red phosphor, then emit light that has passed through the second resin through the first resin containing the green phosphor, each of the blue light, the red light and the green light can be efficiently emitted without being interfered with by each other. Consequently, there is an advantageous effect that a light-emitting device having high emission efficiency and capable of generating white light having a peak value of each of the blue light, the red light and the green light can be provided.

In addition, by including the second phosphor in the second resin sealing the light-emitting element, disposing the first resin having a large area to cover the side surfaces or the peripheral side surfaces and the upper surface of the second resin, and providing the lens portion on the upper surface of the first resin facing the light-emitting element, even if a portion of light from the first phosphor is expended on excitation of the second phosphor, the influence of loss of the portion of light from the first phosphor can be minimized; consequently, disposing the first resin having the large area on an outside allows emission efficiency of the light-emitting device to be improved.

Although the embodiments of the present invention have been described with reference to the accompanying drawings, it should be understood that the present invention is not limited to these embodiments, and that various modifications and changes can be made to the embodiments.

What is claimed is:

1. A light-emitting device comprising:
   a substrate;
   a light-emitting element mounted on the substrate;
   a first resin comprising a first phosphor and arranged in direct contact with an upper surface and at least an upper portion of peripheral four side surfaces of the light-emitting element, and the first resin covering the upper surface and the at least upper portion of the peripheral four side surfaces of the light-emitting element; and
   a second resin comprising a second phosphor and arranged in direct contact with a lower portion of the peripheral four side surfaces of the light-emitting element, and the second resin covering the lower portion of the peripheral four side surfaces of the light-emitting element,
   the first phosphor being configured to emit light with emission wavelength longer than emission wavelength of light from the light-emitting element, and the second phosphor being configured to emit light with emission wavelength longer than emission wavelength of light from the first phosphor.

2. The light-emitting device according to claim 1, wherein the first resin positioned at an upper side of the light-emitting element and the second resin positioned at a lower side of the light-emitting element are overlapped with each other in top plan view.

3. The light-emitting device according to claim 1, wherein the light-emitting element is a blue light-emitting element.

4. The light-emitting device according to claim 3, wherein the light-emitting element is configured to emit light with emission wavelength ranged from 470 nm to 490 nm.

5. The light-emitting device according to claim 2, wherein the first phosphor is configured to be excited by light with a shorter wavelength than 500 nm to emit light with emission wavelength longer than emission wavelength of light from the light-emitting element, and the second phosphor being configured to be excited by light with a shorter wavelength than 600 nm to emit light with emission wavelength longer than wavelength of light from the first phosphor.

6. The light-emitting device according to claim 1, wherein the first phosphor is configured to emit green light with the emission wavelength longer than the emission wavelength of light from the light-emitting element.

7. The light-emitting device according to claim 6, wherein the first phosphor comprises at least one selected among $SrGa_2S_4$:Eu, Pr, $(BaSr)_2SiO_4$:Eu, $BaMgAl_{10}O_{17}$:Eu, and Mn.

8. The light-emitting device according to claim 6, wherein the green light is configured to be green light with wavelength peak around 530 nm.

9. The light-emitting device according to claim 1, wherein the second phosphor is configured to emit red light with the emission wavelength longer than light from the first phosphor.

10. The light-emitting device according to claim 9, wherein the second phosphor comprises at least one selected among $CaALSiN_3$ and $(SrCa)AlSiN_3$:Eu.

11. The light-emitting device according to claim 9, wherein the red light is configured to be red light with wavelength peak around 650 nm.

12. The light-emitting device according to claim 1, wherein the substrate comprises conductive patterns provided on at least an upper surface of the substrate.

13. The light-emitting device according to claim 7, wherein the second resin comprising the second phosphor is in contact with a lower surface of the light-emitting element.

14. The light-emitting device according to claim 13, wherein the light-emitting element is bonded to one of the conductive patterns of the substrate through the second resin comprising the second phosphor.

15. The light-emitting device according to claim 1, wherein the substrate comprises a hollow, and the light-emitting element is arranged in the hollow of the substrate.

16. The light-emitting device according to claim 15, wherein the second resin is filled in a space of the hollow to surround the lower portion of the peripheral side surfaces of the light-emitting element.

17. The light-emitting device according to claim 1 further comprising:
a frame surrounding the peripheral side surfaces of the first resin and the second resin.

18. A light-emitting device comprising:
a substrate;
a light-emitting element mounted on the substrate;
a first resin comprising a first phosphor and arranged in direct contact with an upper surface and at least an upper portion of peripheral four side surfaces of the light-emitting element, and the first resin covering the upper surface and the at least upper portion of the peripheral four side surfaces of the light-emitting element; and
a second resin comprising a second phosphor and arranged in direct contact with a lower portion of the peripheral four side surfaces of the light-emitting element, and the second resin covering the lower portion of the peripheral four side surfaces of the light-emitting element,
wherein the first phosphor is configured to be excited by light with a shorter wavelength than 500 nm to emit light with emission wavelength longer than emission wavelength of light from the light-emitting element, and the second phosphor being configured to be excited by light with a shorter wavelength than 600 nm to emit light with emission wavelength longer than wavelength of light from the first phosphor,
wherein the first resin positioned at an upper side of the light-emitting element and the second resin positioned at a lower side of the light-emitting element are overlapped with each other in top plan view.

19. The light-emitting device according to claim 18, wherein the light-emitting element is configured to emit light with emission wavelength ranged from 470 nm to 490 nm.

* * * * *